United States Patent [19]

Farquharson et al.

[11] Patent Number: 4,557,411

[45] Date of Patent: Dec. 10, 1985

[54] INTERCONNECTED SOLDER PADS AND THE METHOD OF SOLDERING

[75] Inventors: Robert J. Farquharson, Atlantic Highlands; Stanton T. Gerns, Cedar Knolls, both of N.J.

[73] Assignees: AT&T Information Systems, Holmdel; AT&T Bell Laboratories, Murray Hill, both of N.J.

[21] Appl. No.: 545,470

[22] Filed: Oct. 26, 1983

[51] Int. Cl.$^4$ .................................................. B23K 35/14
[52] U.S. Cl. .................................. 228/56.3; 156/644; 156/659.1
[58] Field of Search .............. 228/56 R, 180 R, 246, 228/247; 156/659.1, 644; 430/315, 320

[56] References Cited

U.S. PATENT DOCUMENTS

| | | | |
|---|---|---|---|
| 3,931,719 | 1/1976 | Schwab | 156/644 X |
| 4,050,621 | 9/1977 | Bouley | 228/56 R X |
| 4,216,350 | 8/1980 | Reid | 228/56 R X |
| 4,328,921 | 5/1982 | Liang | 228/222 |
| 4,336,639 | 6/1982 | Berglund | 29/25.35 |
| 4,341,921 | 7/1982 | Simpson | 174/84 |
| 4,372,037 | 2/1983 | Scapple et al. | 29/613 |

Primary Examiner—Kenneth J. Ramsey
Attorney, Agent, or Firm—David H. Tannenbaum

[57] ABSTRACT

A new soldering technique is being employed whereby solder is formed into pads, each pad connected to the next pad by a solder link. The pads are formed on center spacings equal to the spaces between assembly board terminals and heated to the melting point of the solder whereupon surface tension of the solder collapses the interconnecting pad links thereby leaving the terminals electrically isolated. The solder pad assembly is made by an etching process.

5 Claims, 5 Drawing Figures

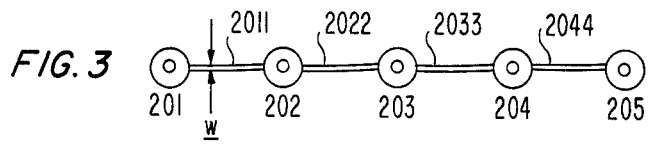
FIG. 3
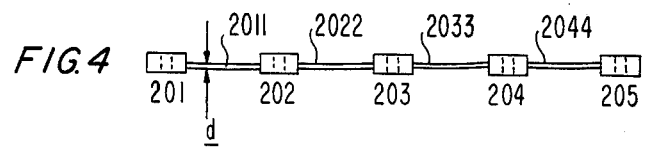
FIG. 4
FIG. 5
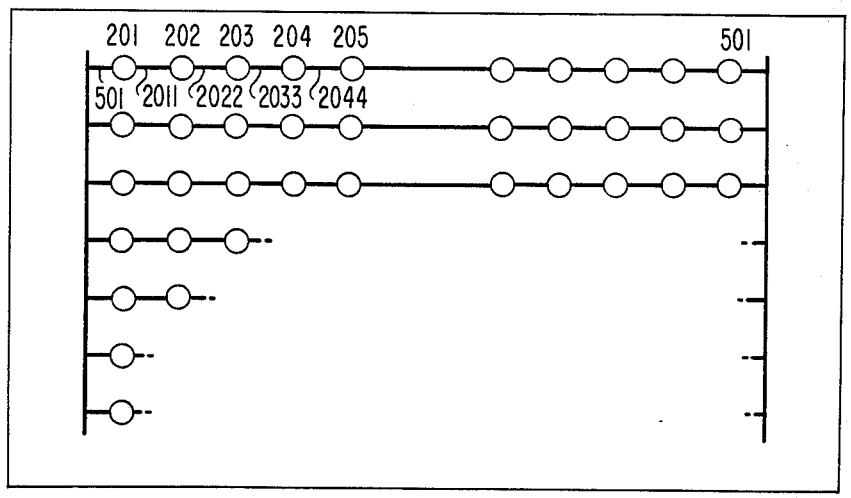

INTERCONNECTED SOLDER PADS AND THE METHOD OF SOLDERING

BACKGROUND OF THE INVENTION

This invention relates to soldering and more particularly to a solder structure and method for applying solder to a row of terminals.

The art of soldering is old and well-known and the techniques are as varied as the apparatus types which must be soldered. However, from time to time, problems still manage to arise in which the traditional methods and solder structures are inadequate. For example, in situations where wires must be soldered onto terminals which project from a board one common method is to cut the solder into round donut shapes and then place each individual donut over the terminal. A quick application of heat to the solder ring and the wire becomes securely attached to the terminal. For high volume production such a technique is economically possible because sophisticated tooling can be justified. However, for low volume (such as for prototypes) tooling is unavailable and hand placement is time consuming and uneconomical since each donut must be picked up, usually with tweezers, and then dropped over the terminal.

Accordingly, a need exists in the art for a better solder structure which allows for easier placement of the solder on the terminals and for a method of making such a solder structure in a low cost fashion.

SUMMARY OF THE INVENTION

These and other problems have been solved, in one embodiment, by using a solder structure where a number of individual solder rings are interconnected by a solder link yielding a semi-rigid structure which can be easily picked up and placed on the terminals. The spacing between the center points of the solder rings is established to be identical with the spacings between the terminals. Thus, for a terminal set having five terminals, a solder unit having five rings linked together is placed over the terminals in one operation. Heat is applied to the entire structure (solder ring and terminal) and the solder link between the rings separates, due to surface tension of the melted solder.

BRIEF DESCRIPTION OF THE DRAWING

These and other objects and features together with the operation and utilization of the present invention will be more fully apparent from the illustrative embodiment shown in conjunction with the drawing in which:

FIGS. 3 and 4 show the interconnected solder units;
and
FIG. 5 shows a sheet of etched solder units.

DETAILED DESCRIPTION

Figure 1:
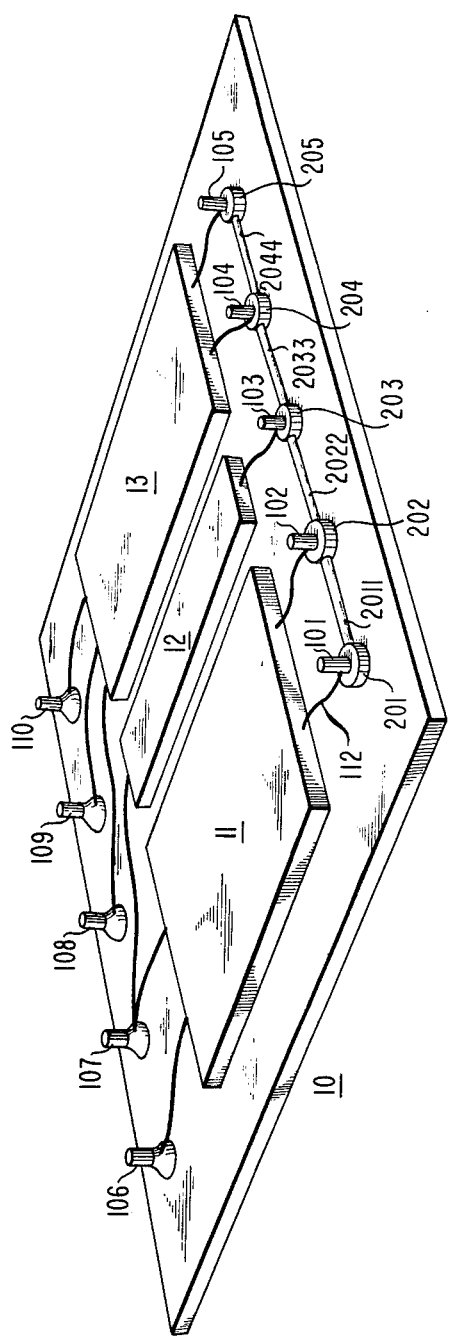
FIG. 1 shows a view of a wiring board.

As seen in FIG. 1, assembly board 10 has terminals 101-105 lined up one edge of the assembly board and terminals 106-110 lined up on the other edge of the board. Circuit elements such as transistors, integrated circuits and the like are connected between the terminals by wires such as wires 112 and 113 which could be either discrete or printed wiring paths. In a typical situation it is desired to place a component, such as component 11, on assembly board 10 and then fasten wire 113 to terminal 106 and fasten wire 112 to terminal 101. When printed wire paths are used, a loop in the wire path would surround the terminal. After all such components are placed on assembly board 10 and the associated wires are attached to the proper terminals, or pushed through predrilled holes, it is then desired to permanently secure the wires to the terminals (or to the holes) by soldering.

As discussed above, one technique for soldering the wires to the terminals would be to pre-cut the solder into donuts and then slip each donut around the terminal and then apply heat to the solder donut so that it melts and flows around the terminal connection. If the individual donuts are fashioned such that they are interconnected by a solder link, such as link 2011, then a person or machine can pick up an entire unit of, say five, solder donuts and place them over the five terminals on one edge of the assembly board in one operation. Once the donut link assembly is positioned on the terminals, heat is applied to all of the terminals to bring the associated solder donuts to their melting point. This melting of the solder donuts creates surface tension which pulls the solder link apart causing the solder to reform around each terminal.

Terminals 101-105 of FIG. 1 show a set of five terminals around which a solder donut link assembly has been placed prior to heating. Terminals 106-110 show a set of terminals after heat has been applied to the donut link assembly. Note that on terminals 106-110 the solder link interconnecting the donuts has been absorbed in each of the solder connections, thereby rendering the terminals electrically independent.

Figure 2:
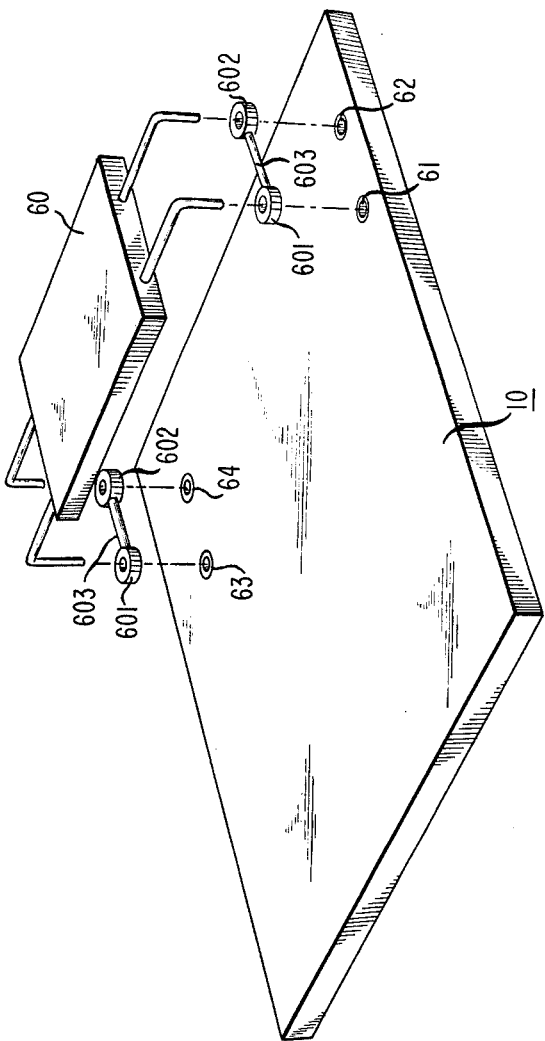
FIG. 2 shows an alternate view of the wiring board.

FIG. 2 shows a dual-in-line package (DIP) with four wire terminals which must be solder connected to holes 61, 62, 63 and 64. Each hole in turn has a solderable surface, such as copper, around its rim. The solder assembly which consists of rings 601 and 602 interconnected by line 603 is placed on the wire terminals. The terminals are placed in the holes and the solder assembly is heated; the links break, and the terminals become electrically isolated from each other and attached to the holes by the melted and reformed solder.

FIG. 3 shows the top view of a five unit solder link assembly while FIG. 4 shows the side view of the same assembly. This assembly is constructed for a five terminal in-line set and, of course, it is understood that the number of terminals along an edge of a board can vary and they need not be in a straight line so long as the solder link between the donuts is at least as long as the distance between the terminals. As will be seen, since the solder link donut assembly is etched, any interdonut spacing is available. Thus, the terminals need not be evenly spaced.

It is understood that the thickness of the link d could be less than or equal to the thickness of each ring. The same holds true for the width w. These dimensions are adjusted so that the volume of solder of the link provides enough solder to make the solder connection and not so much that surface tension is incapable of separating the ring.

Also, it should be understood that the elements, such as element 11, can be soldered directly to the terminal without wires if holes were to be established in the element coinciding with the terminals.

It should also be noted that the solder structure need not be rings but will work for situations where individual patches or pads of solder of any shape are required at various points. One such situation is where a surface mounted device is overlayed onto a printed wiring board and the terminals of the device are surface mounted instead of being pushed through holes. In this arrangement, the continuous nature of the solder structure allows easy placement of the solder and when the heat is applied the interconnecting links separate.

FIG. 5 shows a method of manufacturing the solder link assemblies using an etched solder sheet. This method has proven more economical than taking a solder bar and drilling or punching holes for the rings. Using this technique, solder link assemblies of any number can be created either in a straight row or in a matrix for use as discussed above. It should be noted that at the ends of the rows an extra link, such as 501, is added so that the first and last ring assembly contains enough solder when melted to perform the function of securing terminals. The etched structure shown in FIG. 5 is constructed starting from a sheet of solder of suitable thickness and applying a photo sensitive etchant resist to each surface of the selected sheet. A photo mask (not shown) pattern is applied to the solder sheet over the resist using standard printed circuit techniques and the sheet is etched in accordance with the pattern using ferric chloride or any other etchant material used in the printed circuit processes. The photo pattern determines the size and shape of the rings and links. The etching process creates strings of rings and links joined together as determined by the photo mask pattern.

While a single row has been shown, it is possible to construct the solder link assembly in a matrix arrangement having multi-rows with the links having different widths and thicknesses and with the rings having different inside and outside dimensions as well as different shapes.

What is claimed is:

1. A solder structure comprising a plurality of solder pads interconnected by a link of solder and wherein each said link separates from said pads upon the application of heat, and wherein each said link is constructed having a variable volume of solder dependent upon the volume of solder necessary at the associated pad.

2. A solder structure comprising a plurality of solder pads interconnected by a link of solder and wherein each said link separates from said pads upon the application of heat, and wherein said solder structure is a multi-row matrix assembly interconnected by a plurality of links, said links also separating upon the application of heat to said matrix.

3. A method of manufacturing solder pad assemblies, said method comprising the steps of
   selecting a sheet of solder,
   applying a photo sensitive etchant resist to both surfaces of said selected sheet,
   applying, by standard printed circuit techniques, a photo pattern of pads to said selected sheet over said etched resist, and
   etching the solder sheet to form a series of interconnected pads by using an etching material.

4. The invention set forth in claim 3 wherein said etchant material is ferric chloride.

5. The invention set forth in claim 3 wherein said pad assemblies are rings interconnected by a link, and wherein the width of each said link is controlled by said photo mask pattern and wherein the length of each said link is controlled by the same photo mask pattern.

* * * * *